United States Patent [19]
Berg et al.

[11] 4,399,453
[45] Aug. 16, 1983

[54] LOW THERMAL IMPEDANCE PLASTIC PACKAGE

[75] Inventors: Howard M. Berg, Scottsdale; Gary L. Lewis, Peoria; Curtis W. Mitchell, Phoenix, all of Ariz.

[73] Assignee: Motorola, Inc., Schaumburg, Ill.

[21] Appl. No.: 246,506

[22] Filed: Mar. 23, 1981

[51] Int. Cl.³ .................. H01L 23/02; H01L 27/14; H01L 33/00
[52] U.S. Cl. .................................. 357/81; 357/17; 357/30; 357/74; 350/96.20; 350/96.21
[58] Field of Search .................. 357/81, 74, 17, 30; 350/96.21, 96.20

[56] References Cited
U.S. PATENT DOCUMENTS

| | | | |
|---|---|---|---|
| 3,219,748 | 11/1965 | Miller | 357/74 |
| 3,340,345 | 9/1967 | Campbell | 357/74 |
| 4,186,996 | 5/1980 | Bowen et al. | 357/74 |
| 4,295,152 | 10/1981 | Khoe et al. | 357/74 |
| 4,302,070 | 11/1981 | Nakayama et al. | 350/96.21 |
| 4,307,934 | 12/1981 | Palmer | 357/74 |

Primary Examiner—Andrew J. James
Assistant Examiner—J. Carroll
Attorney, Agent, or Firm—Paul F. Wille

[57] ABSTRACT

A package for fiber optic semiconductor devices is disclosed in which heat is conducted by both a heat spreader and through a plastic enclosure portion of the package.

7 Claims, 3 Drawing Figures

LOW THERMAL IMPEDANCE PLASTIC PACKAGE

BACKGROUND OF THE INVENTION

This invention relates to a package for a fiber optic semiconductor device and, in particular, to a package having improved thermal characteristics.

A continuing concern in the manufacture of semiconductor packages for fiber optics is the amount of light launched into the system fiber. If greater luminous flux were available, one could use longer lengths of system fiber. There are two ways to increase the luminous flux in a fiber. One is to increase the luminosity of the source. The other is to improve the coupling between the photoactive area of the semiconductor and the optical fiber. This invention relates to the former and is useful for both light emitting and light sensing semiconductor devices.

In a typical application, fiber optic semiconductor devices are mounted parallel to printed circuit boards, e.g. in a fiber optical data link. In such applications, it is desirable to retain the compactness of the present ferruled semiconductor device as well as the capability for horizontal mounting, particularly since many systems have closely spaced printed circuit boards with expensive board area.

With fiber optic sources, i.e. light emitting devices, a problem develops in that the amount of light produced depends on the input power or, more specifically, on the forward current through the diode. It is desired to operate at the highest forward current possible, without compromising reliability. The maximum forward current is limited by the rise in junction temperature, which is proportional to the power dissipated by the junction times the thermal impedance of the package. The thermal impedance of a package is dependent, in part, on the size of the package and, in part, on the package materials and design. Thus the problem is to dissipate larger amounts of power in packages of a given size and shape, while maintaining low cost. While mounting a device to a heatsink instead of directly to the printed circuit board would aid heat dissipation, the advantages of compactness and low cost of the device would be lost. Alternatively, as others have done in the art, one can simply make the package bigger. Making the package bigger would require a plurality of different sized connector hardware, all of which must be maintained in inventory, which is undesirable. Also making the package bigger increases cost and board usage.

In view of the foregoing, it is an object of the present invention to provide a low-cost package having low thermal impedance.

Another object of the present invention is to provide a package having reduced thermal impedance and the same outside dimensions as previous packages.

A further object of the present invention is to provide a more luminous fiber optic semiconductor device.

Another object of the present invention is to provide a more luminous fiber optic semiconductor device adapted to use the connector as a heatsink.

A further object of the present invention is to provide a plastic package of reduced thermal impedance, acting as a heat spreader for the semiconductor element within.

SUMMARY OF THE INVENTION

The foregoing objects are achieved in the present invention wherein a semiconductor die or chip is mounted on a thermally conductive header and surrounded by a thermally conductive, cylindrical member. A heat spreader is attached to the outside of the header and the header, die, and cylinder are enclosed in plastic. Heat is conducted to the connector, which acts as a heatsink, by the heat spreader and by the cylinder, which transfers the heat through the plastic. The connector transfers heat to both the PC board and the ambient air.

DETAILED DESCRIPTION OF THE INVENTION

A more complete understanding of the present invention can be obtained by considering the following detailed description in conjunction with the accompanying drawings, in which.

DETAILED DESCRIPTION OF THE INVENTION

Figure 1:
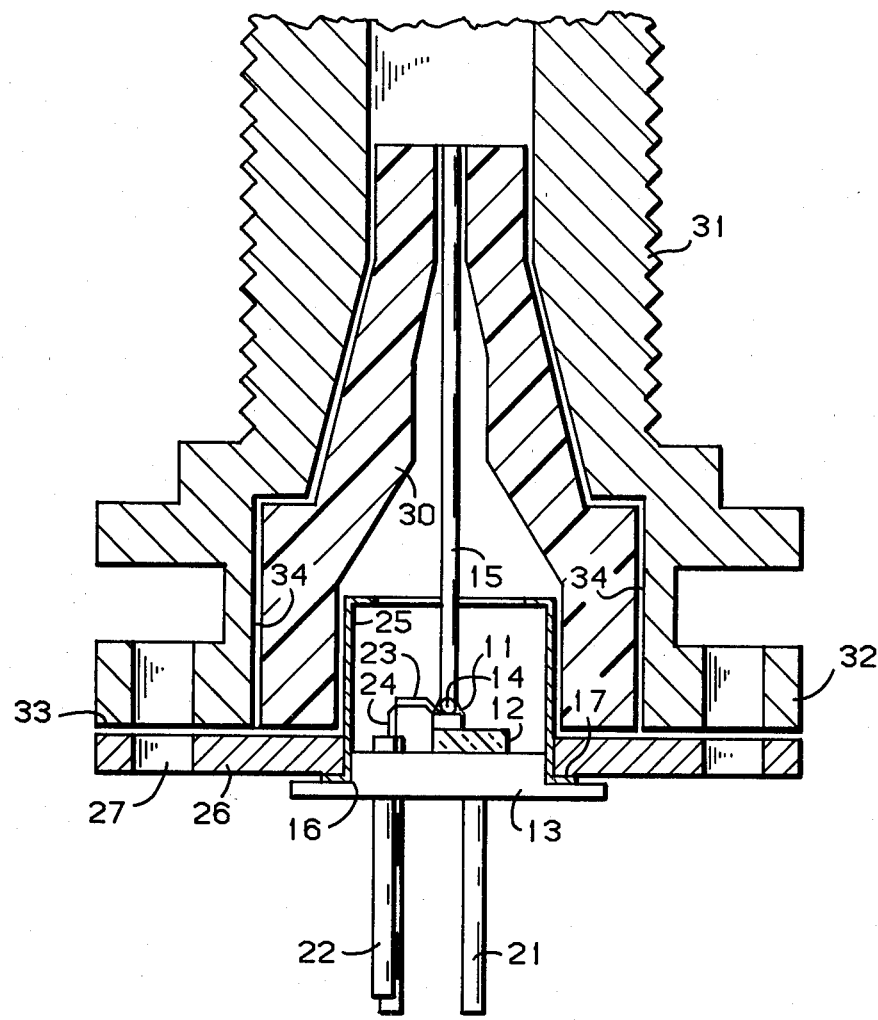
FIG. 1 illustrates in cross-section a preferred embodiment of the present invention.

FIG. 1 illustrates a preferred embodiment of the present invention wherein the package comprises an enclosure in the shape of a truncated cone surrounding a semiconductor die having a photo-emissive or photo-responsive area (herein collectively referred to as a "photo-active" area). The package is thus similar in outline to existing packages and compatible with existing connectors.

Figure 2:
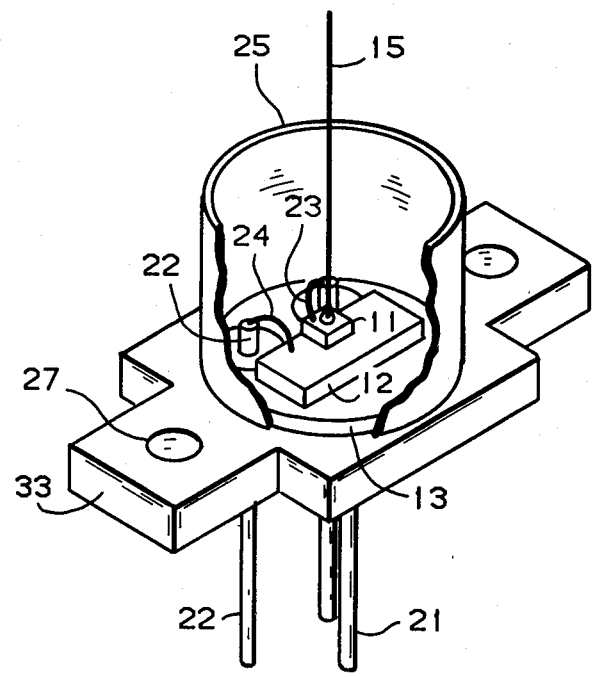
FIG. 2 illustrates in perspective several elements of a package in accordance with the present invention.

Specifically, with reference to both FIGS. 1 and 2 where common elements have the same reference number, semiconductor chip 11 is attached to a thermally conductive electrically insulating member 12, such as beryllium oxide. Insulating member 12 is connected to header 13 which forms an outside portion of the package. Lens 14 is positioned adjacent the photo-active area of semiconductor die 11 to enhance the coupling of light either to or from the photo-active area. Optically coupled to lens 14 is fiber 15 which extends upwardly from the lens to the outside of the package.

Thermally conductive, electrically insulating member 12 is preferably included both to isolate semiconductor die 11 from header 13 and to spread heat from the small semiconductor junction area to a much larger header area. If desired, this member may be eliminated and semiconductor die 11 electrically and thermally connected to header 13, with some penalty in thermal performance. To achieve a low cost package, currently available piece parts can be used. For example, header 13 preferably comprises a TO-46 type header, i.e. a metal disk comprising a central raised portion surrounded by an annular portion connected thereto at shoulder 16. As well known in the art, leads 21 and 22 are provided as appropriate and connected to chip 11 by lead wires 23 and 24.

Surrounding the raised portion of header 13 is a thermally conductive cylindrical member 25. As illustrated in FIG. 1, cylindrical member 25 comprises a lip portion 17 which engages shoulder 16. Extending orthogonally outward from cylindrical member 25 is heat spreader 26, which engages cylindrical member 25 on the concave side of lip 17. Near the outward end of heat spreader 26 are fastening means 27, specifically comprising apertures through which bolts, pins or other attaching members may be secured. Alternatively, spring clips engaging heat spreader 26 and extensions 32 can be used. Overlying the interior portion of heat spreader 26 and surrounding cylindrical member 25 and fiber 15 is enclosure 30, which may comprise any suitable plastic. Further, enclosure 30 may be formed as a separate piece part or may be injection molded in a suitable mold about the remaining elements of the package. As known in the art, the narrow end portion of enclosure 30 is squared and polished to provide a reference surface to which fiber optic transmission lines can be connected.

In operation, a device in accordance with the present invention is inserted into connector 31 and attached thereto by way of holes 27 or clips. Connector 31 comprises extensions 32 having a surface 33 which mates with heat spreader 26. During operation of chip 11, heat generated thereby is coupled through electrical insulator 12 and spread over the large surface area of header 13. Header 13, in turn, conducts the heat to cylindrical member 25 and heat spreader 26. Contrary to what might be expected due to enclosure 30 comprising plastic, cylindrical member 25 conducts heat away from header 13 and chip 11 by transferring the heat through enclosure 30 to surface 34 of connector 31. Additional heat is conducted by heat spreader 26 to connector 31 by way of surface 33. The mass and surface area of connector 31 substantially exceeds the masses and surface areas of header 13, cylindrical member 25, and heat spreader 26. As such, connector 31 acts as the heat sink for chip 11 in operation, as well as a heat spreader to the PC board.

By way of comparison, an early package employing the truncated cone ferrule and having a TO-18 header without a cylindrical member, thermally conductive insulator, or heat spreader, exhibited a thermal impedance of 405 degrees centigrade per watt when not inserted in a connector, and 350 degrees centigrade per watt when inserted in the connector. In contrast, a device in accordance with the present invention exhibits a thermal impedance of 240 degrees centigrade per watt outside a connector and 165 degrees centigrade per watt when inserted in a connector. Thus, a package in accordance with the present invention permits one to double the forward current while maintaining the same junction temperature as for devices of the prior art.

Figure 3:
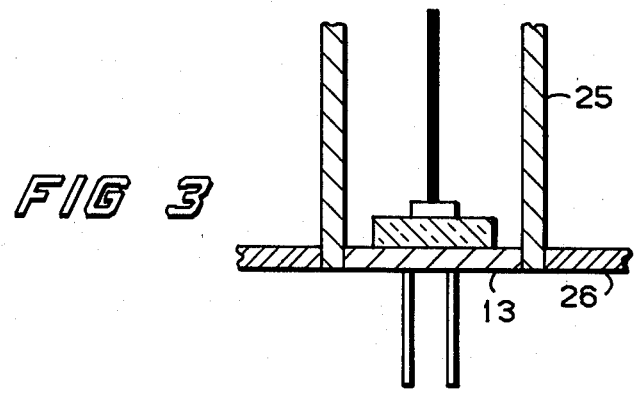
FIG. 3 illustrates an alternative embodiment of the present invention.

FIG. 3 illustrates an alternative embodiment of the present invention wherein press-fit parts are used. Specifically, header 13 closely fits within cylindrical member 25 which, in turn, closely fits within the central aperture of heat spreader 26. In this embodiment, a package in accordance with the present invention has a planar bottom surface formed by the three parts. The fiber, semiconductor chip, and insulating member are attached as before.

There is thus provided by the present invention a distinctly improved package having the same case outlined as prior art devices, yet obtaining significantly greater light output.

Having thus described the invention it will be apparent to those of skill in the art that various modifications can be made within the spirit and scope of the present invention. For example, the particular shape of enclosure 30 is not critical and can be adapted to any standard package outline. Similarly, the number and positioning of the electrical leads can be varied depending on the particular chip used. Header 13 and cylindrical member 25, if one is using prior art piece parts, comprise low coefficient of expansion materials such as KOVAR or (Trademark) what is known as alloy 42 and nickel, respectively. Heat spreader 25 is preferably copper or plated copper although other materials of comparable thermal conductivity can be used. Similarly, copper or comparable material can be used for header 13 and cylindrical member 25.

We claim:

1. A fiber optic semiconductor device having a low thermal impedance comprising:
   a thermally conductive header;
   a semiconductor chip, having a photo-active area, thermally connected to said header;
   a segment of fiber optically connected to said photo-active area; and
   heat spreader means thermally coupled to said header, said heat spreader means extending outwardly from said header for conducting heat away from said semiconductor chip;
   a cylindrical, thermally conductive member orthogonal to and thermally connected to said heat spreader; and
   plastic enclosure means engaging said heat spreader for enclosing said semiconductor chip, said cylindrical member, and said fiber, said fiber extending through a surface of said enclosure means, and wherein said cylindrical member conducts heat away from said semiconductor chip through said enclosure means.

2. The package as set forth in claim 1 wherein said cylindrical member comprises a lip portion, the convex side of which engages said header and the concave side of which engages said heat spreader.

3. The package as set forth in claim 2 wherein said header, heat spreader, and cylindrical member each comprise metal or metal alloy.

4. The package as set forth in claim 2 wherein said heat spreader comprises fastening means at the outward ends thereof.

5. The package as set forth in claim 1 and further comprising:
   thermally conducting, electrically insulating means interconnecting said chip and said header.

6. The package as set forth in claim 1 and further comprising:
   a lens positioned adjacent said photo-active area for optically connecting said fiber and said photo-active area.

7. The package as set forth in claim 1 wherein said package is characterized by a thermal impedance of less than 250° C. per watt of power dissipated by said chip.

* * * * *

Notice of Adverse Decision in Interference

In Interference No. 102,088, involving Patent No. 4,399,453, H. M. Berg, G. L. Lewis and C. W. Mitchell, LOW THERMAL IMPEDANCE PLASTIC PACKAGE, final judgment adverse to the patentees was rendered Sept. 12, 1989, as to claims 1-7.

[*Official Gazette November 21, 1989*]